(12) United States Patent
Shirley et al.

(10) Patent No.: US 7,470,638 B2
(45) Date of Patent: Dec. 30, 2008

(54) SYSTEMS AND METHODS FOR MANIPULATING LIQUID FILMS ON SEMICONDUCTOR SUBSTRATES

(75) Inventors: Paul D. Shirley, Meridian, ID (US); Hiroyuki Mori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 219 days.

(21) Appl. No.: 11/359,730

(22) Filed: Feb. 22, 2006

(65) Prior Publication Data
US 2007/0197050 A1    Aug. 23, 2007

(51) Int. Cl.
*H01L 21/00* (2006.01)

(52) U.S. Cl. .................. 438/800; 438/597; 257/259; 118/52

(58) Field of Classification Search .......... 438/597, 438/787, 800; 118/52, 321, 323; 257/259
See application file for complete search history.

(56) References Cited

U.S. PATENT DOCUMENTS

| | | | |
|---|---|---|---|
| 4,989,345 A | 2/1991 | Gill, Jr. | |
| 5,202,849 A | 4/1993 | Nozaki | |
| 5,250,114 A | 10/1993 | Konishi et al. | |
| 5,648,175 A | 7/1997 | Russell et al. | |
| 5,778,554 A | 7/1998 | Jones | |
| 5,948,701 A | 9/1999 | Chooi et al. | |
| 5,974,680 A | 11/1999 | Anderson et al. | |
| 5,974,681 A | 11/1999 | Gonzalez-Martin et al. | |
| 6,012,470 A | 1/2000 | Jones | |
| 6,029,369 A | 2/2000 | Gonzalez-Martin et al. | |
| 6,077,742 A | 6/2000 | Chen et al. | |
| 6,090,720 A | 7/2000 | Satoh | |
| 6,265,323 B1 * | 7/2001 | Nakamura et al. | 438/748 |
| 6,423,380 B1 * | 7/2002 | Courtenay | 427/425 |
| 6,460,269 B2 | 10/2002 | Cho et al. | |
| 6,503,335 B2 | 1/2003 | Hohl et al. | |
| 6,719,932 B2 | 4/2004 | Clikeman et al. | |
| 6,742,279 B2 | 6/2004 | Lubomirsky et al. | |
| 6,786,224 B2 | 9/2004 | Wong | |
| 6,834,440 B2 | 12/2004 | Lee | |
| 6,864,186 B1 | 3/2005 | Yates | |
| 6,892,472 B2 | 5/2005 | Quarantello | |
| 7,199,062 B2 * | 4/2007 | Wei | 438/758 |
| 2003/0139063 A1 * | 7/2003 | Yamada et al. | 438/782 |

* cited by examiner

*Primary Examiner*—Phuc T Dang
(74) *Attorney, Agent, or Firm*—TraskBritt

(57) ABSTRACT

A semiconductor substrate undergoing processing to fabricate integrated circuit devices thereon is spun about a rotational axis while introducing liquid onto a surface of the substrate. An annular-shaped sheet of liquid is formed on the surface, the sheet of liquid having an inner diameter defining a liquid-free void. The size of a diameter of the void is reduced by manipulation of the annular-shaped sheet of liquid. The void may then be enlarged until the surface is substantially dry. The annular-shaped sheet of liquid may be formed and altered by selectively moving a contact area on the surface of the substrate on which the liquid is introduced. Systems for processing a substrate and configured to deposit and manipulate a sheet of liquid thereon are also disclosed.

19 Claims, 5 Drawing Sheets

SYSTEMS AND METHODS FOR MANIPULATING LIQUID FILMS ON SEMICONDUCTOR SUBSTRATES

BACKGROUND OF THE INVENTION

1. Field of the Invention

The present invention relates generally to methods and systems for removing liquids from surfaces of semiconductor substrates such as wafers. More particularly, the present invention relates to systems and methods for reducing or eliminating the presence of residues on a substrate surface following the removal of liquids therefrom by selective manipulation of the liquids on the substrate surface.

2. Discussion of Related Art

Integrated circuit devices such as microprocessors and memory devices are typically fabricated upon a semiconductor substrate, such as a full or partial wafer of semiconductor material (e.g., silicon, indium phosphide, gallium arsenide, etc.), or other substrate including one or more layers of semiconductor material thereon, such as a silicon-on-insulator (SOI) type substrate (such as, a silicon-on-glass (SOG), silicon-on-sapphire (SOS), silicon-on-ceramic (SOC), etc.), or any other suitable fabrication substrate. A large number of identical integrated circuit devices typically are fabricated on a single substrate, and the substrate is then diced, sawed, or cut, to physically separate individual semiconductor devices from one another.

Semiconductor substrates are subjected to a significant number of individual processes during the fabrication of integrated circuitry thereon. These processes often include growth or deposition of material layers, ion doping or implanting, photolithography processes, etc. These processes may be preceded or followed by cleaning steps that involve, for example, scrubbing, spray cleaning, and other such processes. At the completion of cleaning, the substrate may be further processed to remove the cleaning agents and contaminant materials from the surface of the substrate to prevent the formation of contaminating residue on the substrate surface. Often, the last step in a cleaning process includes a rinsing step using clean, de-ionized water followed by a drying process.

For example, it is known in the art to spin a fabrication substrate about a rotational axis extending through the center of the substrate and perpendicular to a major plane thereof while directing a stream of clean de-ionized water onto a surface of the substrate. A substrate may be placed in a spin rinse drier (SRD) that includes a platform coupled to a drive motor. The drive motor may cause the platform to spin at a velocity of, for example, up to 4,000 revolutions per minute (rpm). A stream of water may be directed onto the surface of the substrate while it is spinning to rinse contaminants from the surface of the substrate.

Typically, a rinse liquid is applied to an entire surface of the substrate, including the center of rotation thereof, which is a point on the surface at which the axis about which the substrate is rotated intersects the surface of the substrate to which liquid is applied and removed. As the substrate spins, centrifugal forces cause the liquid to fan out across the surface of the substrate, thereby forming a substantially continuous sheet or film of liquid covering the surface of the substrate. To dry the surface of the substrate, the substantially continuous sheet or film of liquid is removed from the surface of the substrate by interrupting the flow of liquid onto the surface of the substrate while continuing to spin the substrate. Centrifugal forces acting on the liquid cause it to slide off from (or otherwise be removed from) the surface of the substrate in a generally radially outward direction from the center of rotation towards the lateral edges of the substrate.

Often, traces or residue of contaminant material or other unwanted matter, which may be referred to as "water marks" or "doilies," are left behind on the surface of the substrate after the liquid has been removed from the substrate. These traces or residue may include solid matter such as, for example, silica or other materials left behind by prior processing of the substrate, and generally are undesirable as they may interfere with subsequent processing of the substrate. For example, if the rinse process is followed by an etch process in which a portion of the substrate underlying a water mark is to be etched, the solid matter forming the water mark may act as a mask to prevent or block the etch process on the underlying surface of the subject, thereby generating a defect in the structure being defined by the etch on the substrate. If the rinse process is followed by an ion implant process, in which ions of a selected material are to be implanted in a portion of the substrate underlying a water mark, the solid matter forming the water mark may prevent or block the ion implant process, thereby generating a defect in the portion of the substrate, such as a source or drain region, being implanted.

In view of the foregoing, it would be desirable to provide methods and systems for rinsing and drying a semiconductor substrate such as a wafer that minimizes water marks or other contaminant residue or matter left behind on the surface of the substrate.

BRIEF SUMMARY OF THE INVENTION

In one aspect, the present invention includes a method for processing a semiconductor substrate which, for the sake of convenience, may also be termed a "fabrication substrate" herein to signify its status as a semiconductor substrate under fabrication. The fabrication substrate is continuously spun about an axis of rotation while a stream of liquid is directed onto a surface of the fabrication substrate and, in so doing, a substantially continuous annular-shaped sheet or film of the liquid is formed on the surface of the fabrication substrate. The annular-shaped sheet or film of liquid has an inner diameter defining a substantially liquid-free void. The substantially continuous annular-shaped sheet or film of liquid is then manipulated by one or more techniques to reduce a size of the inner diameter of the annular-shaped sheet or film. The substantially liquid-free void may then be enlarged until the surface is substantially dry.

In yet another aspect, the present invention includes a method for processing a semiconductor substrate with a liquid. The semiconductor substrate is continuously spun about a rotational axis, and liquid is introduced onto a contact area on a surface of the semiconductor substrate. The area or region on the surface of the semiconductor substrate onto which the stream of liquid is directed is referred to herein as a "contact area." The contact area is positioned at a first position on the surface of the semiconductor substrate that includes an intersection between the surface of the substrate and the rotational axis. The contact area is moved in a radially outward direction from the first position to a second position to form a substantially annular-shaped sheet or film of the liquid on the surface of the semiconductor substrate. The contact area does not include the intersection between the surface of the semiconductor substrate and the rotational axis in the second position. The contact area is then moved in a radially inward direction from the second position to a third position located radially between the first position and the second position to reduce an inner diameter of the substantially annular-shaped sheet or film of the liquid. The contact area does not include the intersection between the surface of the semiconductor substrate and the rotational axis in either the second position or the third position.

In an additional aspect, the present invention includes a system for processing a fabrication substrate. The system includes a rotatable support member configured to support a fabrication substrate to be processed using the system, a rotation actuator device coupled to the support member and configured to rotate the support member about a rotational axis, and means for dispensing liquid onto a contact area on a surface of the fabrication substrate. The means for dispensing liquid may include at least one liquid-dispensing device that is configured and located to dispense liquid onto a contact area on the surface of the fabrication substrate to be carried by the support member. The system further includes a computer device in communication with the means for dispensing liquid, and the computer device is configured under control of a program to provide the contact area in a first position that includes an intersection between the surface of the fabrication substrate as carried by the support member and the rotational axis, to move the contact area in a radially outward direction from the first position to a second position, and to move to the contact area in a radially inward direction from the second position to a third position radially between the first position and the second position. The contact area does not include the intersection between the surface of the fabrication substrate and the rotational axis in either the second position or the third position.

The features, advantages, and alternative aspects of the present invention will be apparent to those skilled in the art from a consideration of the following detailed description taken in combination with the accompanying drawings.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENTS

Figure 1:
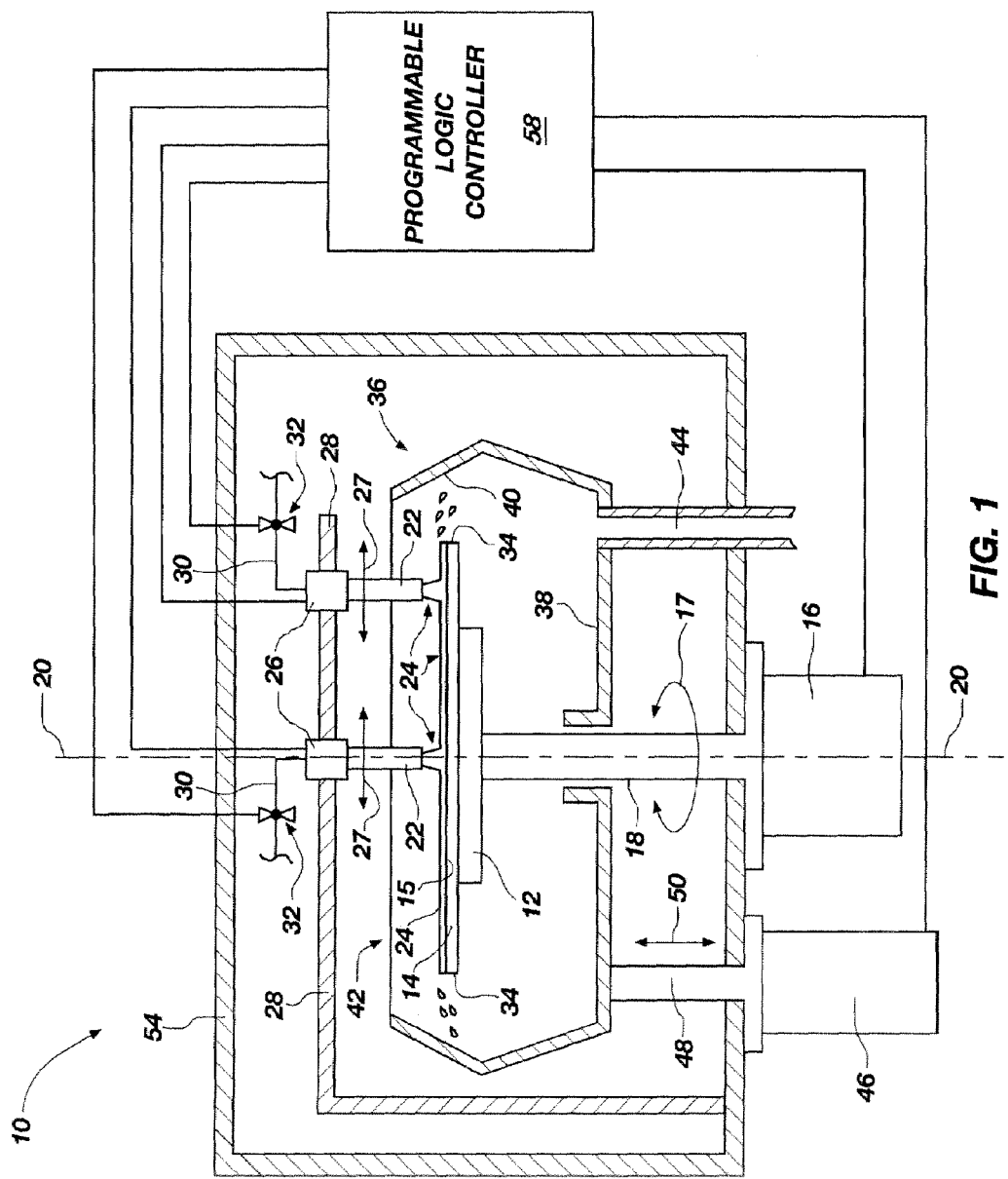
FIG. 1 is a cross-sectional side view of a system for removing liquid from a fabrication substrate in accordance with teachings of the present invention.

In the description which follows, like features and elements have been identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

An illustrative system 10 that embodies teachings of the present invention is shown in FIG. 1. By way of example and not limitation, the system 10 may function as a spin, rinse, dry (SRD) system. The system 10 may include a rotatable support member 12 that is configured to support a fabrication substrate 14 such as, for example, a full or partial semiconductor wafer or other bulk semiconductor substrate that is to be processed using the system 10. For example, the support member 12 may comprise a substantially planar member. A fabrication substrate 14 may be secured to the support member 12 by, for example, using a vacuum chuck or one or more mechanical clamps. In other embodiments, the rotatable support member 12 may include a plurality of structurally supported rollers configured to contact and grip the fabrication substrate 14 substantially along the peripheral edges thereof, as known in the art. The particular shape or configuration of the support member 12 does not contribute to the present invention, and as such, systems including any type or configuration of a support member 12 are within the scope of the present invention.

The system 10 may further include a rotation actuator device 16 that is operatively coupled to, or otherwise associated with, the support member 12 and configured to cause the support member 12 to rotate about a rotational axis 20. By way of example and not limitation, the rotation actuator device 16 may include an electrical motor configured to spin a shaft 18 at a selectively variable speed, and the shaft 18 may be structurally coupled to the support member 12. The rotation actuator device 16 may be configured to spin the shaft 18 and the support member 12 in either a clockwise or counter-clockwise direction, as indicated by the directional arrow 17 shown in FIG. 1. In additional embodiments, the rotation actuator device 16 may be directly coupled to the support member 12 without the use of an intermediate shaft 18 or other element for transmitting the kinetic energy generated by the rotation actuator device 16 to the support member 12.

The system 10 also includes one or more liquid dispensers 22, each of which may be configured and located to direct at least one stream of liquid 24 selectively toward a surface 15 of the fabrication substrate 14. By way of example and not limitation, each liquid dispenser 22 may include a simple open-ended tube or conduit or a liquid-dispensing nozzle coupled to an outlet of a tube or conduit in communication with a liquid source. The stream of liquid 24 may include a substantially continuous column of liquid 24, or a spray or drip of substantially discontinuous droplets of liquid 24. Systems that embody teachings of the present invention, however, may include any other type or configuration of a liquid-dispensing element as long as the liquid-dispensing element is configured and oriented to direct a stream of liquid 24 onto at least one surface 15 of the fabrication substrate 14.

In one particular embodiment shown in FIG. 1, the system 10 may include two liquid dispensers 22, each configured, located and oriented to direct a stream of liquid 24 toward a surface of the fabrication substrate 14. Liquid supply lines 30 may be used to supply liquid 24 from a liquid source (not shown) to the one or more liquid dispensers 22. Selectively controllable flow valves 32 may be provided in the liquid supply lines 30 for selectively controlling the flow of liquid 24 through the liquid supply lines 30 to the liquid dispensers 22.

A liquid dispenser actuator 26 may be coupled to or otherwise operatively associated with each liquid dispenser 22 and configured to cause the liquid dispenser 22 to dispense a stream of liquid 24 onto a selected, or desired, contact area on the surface of the fabrication substrate 14 (e.g., by selectively moving the liquid dispenser 22), as discussed in further detail below.

By way of example and not limitation, each liquid dispenser actuator 26 may be configured to move a liquid dispenser 22 in a linear direction relative to the fabrication substrate 14 as indicated by the directional arrows 27 in FIG. 1. Additionally, and without limiting the scope of the present invention, each liquid dispenser actuator 26 may be supported by and cooperate with a stationary member 28, such as that shown in FIG. 1. The stationary member 28 may include, for example, a simple horizontally extending arm that is structurally coupled to an outer housing 54 of the system 10. Any other type or configuration of stationary member 28 may be used in the system 10. By way of example and not limitation, each liquid dispenser actuator 26 may include an electromechanical device comprising an electrically driven gear set cooperative with teeth on the stationary member 28, a stepper motor cooperative with stationary member 28, or a pneumatically or hydraulically driven piston attached at one end to the stationary member 28.

In additional embodiments, systems that incorporate teachings of the present invention may include liquid dispensers 22 that move in any other manner (e.g., nonlinear) or direction relative to the fabrication substrate 14 or liquid dispensers 22 that are stationary relative to the fabrication substrate 14 but capable of altering the position at which a stream of liquid 24 dispensed thereby contacts the surface 15 of the fabrication substrate 14. For example, systems that embody teachings of the present invention may include liquid dispensers 22 that are stationary relative to fabrication substrate 14 and configured to selectively vary the position at which the stream of liquid 24 dispensed thereby contacts the surface of the fabrication substrate 14 in response to selective variations in the liquid pressure at which the liquid 24 is dispensed from the liquid dispensers 22. Furthermore, systems that incorporate teachings of the present invention may be configured to move a fabrication substrate in a lateral direction in the X-Y plane parallel to the major plane of the fabrication substrate relative to a stationary liquid dispenser 22 and/or stream of liquid 24 dispensed thereby.

The system 10 may include a liquid container 36 positioned to laterally surround the fabrication substrate 14 and configured to capture liquid 24 dispensed from the liquid dispensers 22 as the liquid 24 is spun off of the fabrication substrate 14. For example, the liquid container 36 may include a bottom wall 38 and at least one lateral sidewall 40. At least a portion of the lateral sidewall 40 may be configured to deflect liquid 24 into the container 36 towards the bottom wall 38 as the liquid 24 is spun off of the fabrication substrate 14 and impinges against the lateral sidewall 40. As shown in FIG. 1, the liquid container 36 may be generally configured as a bowl having a bottom wall 38, a sidewall 40, and a top opening 42 through which a fabrication substrate 14 may be positioned on the support member 12. At least a portion of the sidewall 40 may be disposed at an angle with respect to the fabrication substrate 14 and oriented to deflect liquid 24 spinning off from the fabrication substrate 14 towards the bottom wall 38 and into the liquid container 36. The liquid container 36 also may include a drain 44 for removing liquid 24 from the container 36 for disposal, recycling, or further processing.

The liquid container 36 may be configured to move relative to the support member 12 between a first position in which the support member 12 is substantially disposed outside the liquid container 36 and a second position in which the support member 12 is substantially disposed inside the liquid container 36. In such a configuration, placement of a fabrication substrate 14 onto the support member 12 may be facilitated while the liquid container 36 is in the first position, and capture of the liquid 24 spun off of the fabrication substrate 14 by the liquid container 36 may be facilitated while the liquid container 36 is in the second position during processing.

By way of example and not limitation, the system 10 may include a container actuator 46 such as, for example, an electromechanical device or motor, or a pneumatically or hydraulically actuated cylinder that is operatively coupled to a drive shaft 48. The drive shaft 48 may be structurally coupled to the liquid container 36. In this configuration, the container actuator 46 may be configured to selectively move the liquid container 36 in a vertical direction (as indicated by the directional arrow 50) back and forth between a first position in which the support member 12 is substantially disposed outside the liquid container 36 and a second position in which the support member 12 is substantially disposed inside the liquid container 36. The liquid container 36 is shown in the second position in FIG. 1.

In additional embodiments, the rotatable support member 12 may be configured to move up and down in the vertical direction relative to the liquid container 36 instead of, or in addition to, the liquid container 36 being configured to move up and down in the vertical direction as previously discussed. Furthermore, the rotatable support member 12 and the liquid container 36 may be stationary relative to one another.

Optionally, an outer housing 54 may be used to substantially enclose the various components of the system 10.

The system 10 also may include a computer device such as, for example, a programmable logic controller 58 or other electronic controlling device including, for example, at least one processor operably coupled to communicate with at least some of the active, controllable elements or components of the system 10. By way of example and not limitation, the programmable logic controller 58 may communicate with and be configured to selectively control the liquid dispenser actuators 26 for moving the streams of liquid 24 dispensed by the liquid dispensers 22, the flow control valves 32, the rotation actuator device 16 for rotating or spinning the support member 12, and the container actuator 46 for moving the position of the liquid container 36. The programmable logic controller 58 also may communicate with and be configured to selectively control other active, controllable elements or components of the system 10 that are not shown in FIG. 1 or described herein.

In this configuration, the programmable logic controller 58 may be programmed by way of computer software or code to spin, rinse, and dry a fabrication substrate 14 in accordance with a method that embodies teachings of the present invention and facilitates rinsing and drying of a fabrication substrate 14 while minimizing or eliminating water marks or other residues or matter left behind on the surface of the fabrication substrate 14.

Figure 2A:
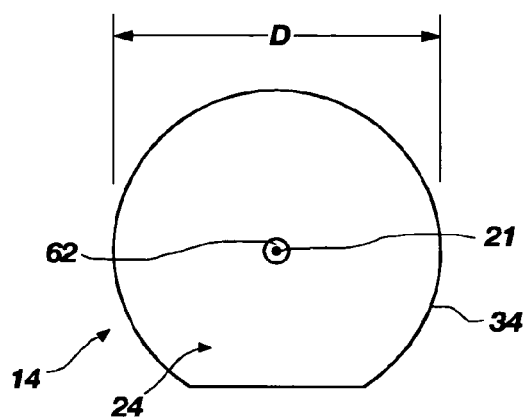
FIGS. 2A-2D are top plan views of the fabrication substrate shown in FIG. 1 illustrating sequential contact areas of liquid directed toward the surface of the fabrication substrate by at least one liquid-dispensing element of the system shown in FIG. 1.

In at least a portion of a processing sequence, the programmable logic controller 58 may be programmed to continuously rotate, or spin, a fabrication substrate 14 about the rotational axis 20 while directing at least one stream of liquid 24 onto a contact area 62 on the surface 15 of the fabrication substrate 14. Referring to FIG. 2A in combination with FIG. 1, the programmable logic controller 58 may be programmed to cause at least one liquid dispenser 22 to direct a stream of liquid 24 onto the surface 15 of the fabrication substrate 14 such that the contact area 62 is in a first, central position that includes an intersection between the surface 15 of the fabrication substrate 14 and the rotational axis 20. This intersection between the surface 15 of the fabrication substrate 14 and the rotational axis 20 (see FIG. 1) may define a center of rotation 21 on the surface 15 of the substrate 14, illustrated in FIGS. 2A-2D. The surface 15 of the fabrication substrate 14 may be substantially covered by a sheet or film of the liquid 24 dispensed from the liquid dispenser 22 (FIG. 1) as the liquid 24 flows from the contact area 62 in a radially outward direction towards the peripheral edges 34 (e.g., circumference) of the fabrication substrate 14. In this manner, the liquid 24 rinses the surface 15 of the fabrication substrate 14. Optionally, at least one additional stream of liquid 24 may be directed onto one or more additional contact areas on the surface 15 of the surface of the fabrication substrate 14, as discussed in further detail below.

Figure 2B:
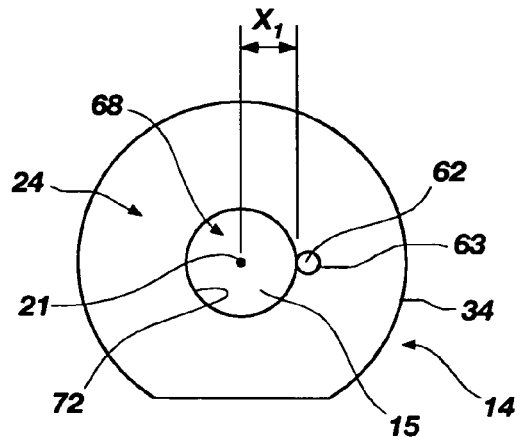

Referring to FIG. 2B in combination with FIG. 1, the programmable logic controller 58 may be programmed to move the liquid dispenser 22 (while continuing to dispense liquid 24 from the liquid dispenser 22) such that the contact area 62 moves in a radially outward direction from the first position shown in FIG. 2A to a second position shown in FIG. 2B to form a substantially circular, substantially dry region 68 on the surface 15 of the fabrication substrate 14 that is centered about the rotational axis 20.

In this second position shown in FIG. 2B, the contact area 62 does not include the center of rotation 21. The contact area 62 may be moved in a radially outward direction from the first position shown in FIG. 2A to the second position shown in FIG. 2B by a distance at which an outer periphery 63 of the contact area 62 is separated from the rotational axis 20 by a distance $X_1$ that is illustrated in FIG. 2B. A substantially continuous annular-shaped sheet or film of liquid 24 may cover the regions on the surface 15 of the fabrication substrate 14 surrounding the substantially circular, substantially dry region 68 as the liquid 24 flows from the contact area 62 in a radially outward direction towards the peripheral edges 34 of the fabrication substrate 14. The substantially continuous annular-shaped sheet or film of liquid 24 may have an inner diameter 72 that defines a void in the sheet or film of liquid 24 through which the substantially circular, substantially dry region 68 on the surface 15 of the fabrication substrate 14 is exposed.

By forming the substantially circular dry region 68, the liquid 24 in the annular-shaped sheet or film of liquid 24 may be more readily spun off from the surface 15 of the fabrication substrate 14 relative to liquid 24 in a substantially continuous sheet or film substantially covering the surface 15 of the fabrication substrate 14. Any finite area or region of liquid 24 on the surface 15 of a spinning fabrication substrate 14 may be subjected to both centrifugal forces and surface tension forces exerted on the area or region of liquid 24 by the surrounding liquid 24. A finite area or region of liquid 24 located on the surface 15 of the fabrication substrate 14 may be subjected to surface tension forces by a portion of liquid 24 on the surface 15 of the fabrication substrate 14 radially inward thereof, relative to the rotational axis 20. These surface tension forces may work against the centrifugal forces acting on the finite area or region of liquid 24. By forming the substantially circular, substantially dry region 68, the surface tension acting on the liquid 24 that directly counteracts the centrifugal forces may be minimized or eliminated, thereby facilitating removal of the liquid 24 from the surface 15 of the fabrication substrate 14 by the centrifugal forces.

As a non-limiting example, the distance $X_1$ may be greater than about five percent (5%) of the distance across the surface 15 of the semiconductor fabrication substrate 14 (e.g., the diameter D shown in FIG. 2A). Accordingly, the inner diameter 72 of the annular-shaped sheet or film of liquid 24 may be greater than about ten percent (10%) of the distance across the surface 15 of the semiconductor fabrication substrate 14 (e.g., the diameter D shown in FIG. 2A).

Figure 2C:
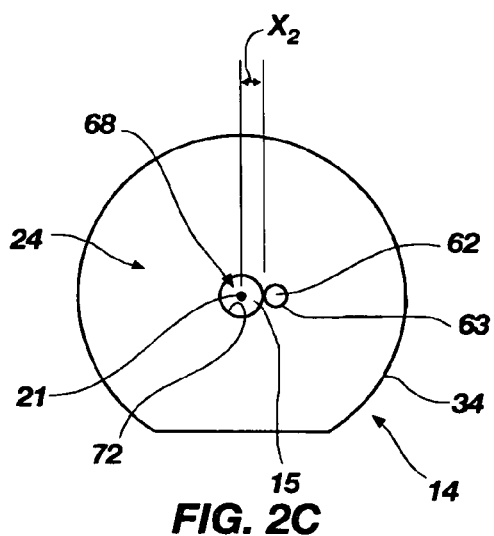

As the contact area 62 is moved from the first position shown in FIG. 2A to the second position shown in FIG. 2B, droplets of liquid 24 may splash onto the regions of the surface 15 of the fabrication substrate 14 radially inward from the contact area 62 (i.e., on the substantially circular, substantially dry region 68). These droplets of liquid 24 may leave water marks, residue, or other unwanted matter on the surface 15 of the fabrication substrate 14. To minimize deposition of such water marks, residue, or other unwanted matter on the surface 15 of the fabrication substrate 14 by these droplets, the programmable logic controller 58 may be programmed to cause the liquid dispenser 22 or dispensers 22 to move the contact area 62 radially inward from the second position shown in FIG. 2B to a third position shown in FIG. 2C that is radially between the first position shown in FIG. 2A and the second position shown in FIG. 2B, thereby reducing (but not eliminating) the diameter of the substantially circular, substantially dry region 68 and the inner diameter 72 of the annular-shaped sheet or film of liquid 24. In the third position shown in FIG. 2C, the outer periphery 63 of the contact area 62 may be separated from center of rotation 21 by a distance $X_2$ that is illustrated in FIG. 2C. Thus, the contact area 62 does not include the center of rotation 21 in the third position shown in FIG. 2C.

It may be desirable to provide a distance $X_2$ that is as small as possible without causing the liquid 24 to cover the center of rotation 21 and forming a substantially continuous sheet of liquid 24 that substantially covers the surface 15 of the fabrication substrate 14. By way of example and not limitation, the distance $X_2$ shown in FIG. 2C may be less than about five percent (5%) of the distance across the surface 15 of the fabrication substrate 14 (e.g., the diameter D shown in FIG. 2A), and, accordingly, the inner diameter 72 of the annular-shaped sheet or film of liquid 24 may be less than about ten percent (10%) of the distance across the surface 15 of the fabrication substrate 14 (e.g., the diameter D shown in FIG. 2A). Furthermore, the diameter of the substantially circular, substantially dry region 68 and the inner diameter 72 of the annular-shaped sheet or film of liquid 24 may be less than about one centimeter (1 cm) in the third position shown in FIG. 2C.

If the contact area 62 is moved from the first position shown in FIG. 2A directly to the third position shown in FIG. 2C, the surface tension of the liquid 24 may prevent the formation of the relatively smaller substantially circular dry region 68 shown in FIG. 2C. Therefore, the contact area 62 may be moved from the first position shown in FIG. 2A to the second position shown in FIG. 2B by a distance that is large enough to cause formation of the substantially circular dry region 68. The contact area 62 may then be moved to the third position shown in FIG. 2C, at which the size of the substantially circular dry region 68 may be minimized without causing the liquid 24 to substantially cover the surface 15 of the fabrication substrate 14 (entirely removing the substantially circular, substantially dry region 68). Moreover, as the contact area 62 is moved from the first position shown in FIG. 2A to the second position shown in FIG. 2B, droplets of liquid 24 may be spattered or sprayed or otherwise deposited onto the substantially circular, substantially dry region 68. By moving the contact area 62 from the second position shown in FIG. 2B to the third position shown in FIG. 2C, these droplets of liquid 24 may be captured by or incorporated into the annular-shaped sheet or film of liquid 24, thereby facilitating complete removal of the liquid 24 from the surface 15 of the fabrication substrate 14.

The programmable logic controller 58 may be programmed to cause the liquid dispensers 22 to direct a stream of liquid 24 toward the first position shown in FIG. 2A, the second position shown in FIG. 2B, and the third position shown in FIG. 2C for predetermined amounts of time ranging from about zero seconds to several minutes or longer, as necessary or desired.

After the liquid dispensers 22 have been caused to position the contact area 62 of a stream of liquid 24 in the third position shown in FIG. 2C, contact between the stream of liquid 24 impinging on the contact area 62 and the surface 15 of the fabrication substrate 14 may be interrupted while continuing to spin the fabrication substrate 14 to remove the liquid 24 from the surface 15 of the fabrication substrate 14. For example, the programmable logic controller 58 may be configured to close one or more flow control valves 32 after the liquid dispensers 22 have positioned the contact area 62 in the third position shown in FIG. 2C. As the fabrication substrate 14 continues to spin after interrupting the stream of liquid 24 impinging on the contact area 62, the inner diameter 72 of the annular-shaped sheet or film of liquid 24 may progress in a radially outward direction towards the peripheral edge 34 (e.g., circumference) of the fabrication substrate 14, as indicated by the directional arrows 74 in FIG. 2D, until substantially all the liquid 24 has been spun off of the surface 15 of the fabrication substrate 14. In other embodiments, the contact area 62 may be moved from the third position shown in FIG. 2C in a radially outward direction towards and beyond the peripheral edge 34 of the fabrication substrate 14 instead of closing one or more flow control valves 32 to interrupt the flow of liquid 24 onto the contact area 62.

By way of example and not limitation, the fabrication substrate 14 may be spun at a rate greater than about 500 revolutions per minute while directing a stream of liquid 24 onto the surface 15 of the fabrication substrate 14. More particularly, the fabrication substrate 14 may be spun at a rate of greater than about 4,000 revolutions per minute while directing a stream of liquid 24 onto the surface 15 of the fabrication substrate 14. Furthermore, the fabrication substrate 14 may be spun at a rate or rates greater than about 2,000 revolutions per minute while the contact area 62 is in each of the first position shown in FIG. 2A, the second position shown in FIG. 2B, and the third position shown in FIG. 2C, and at a rate or rates between about 500 revolutions per minute and about 1,000 revolutions per minute after interrupting contact between the stream of liquid 24 impinging on the surface 15 of the fabrication substrate 14 at the contact area 62. In general, an optimum rate of rotation may be at least partially a function of the size of the fabrication substrate 14, with smaller fabrication substrates 14 possibly requiring greater rates of rotation.

Figure 3A:
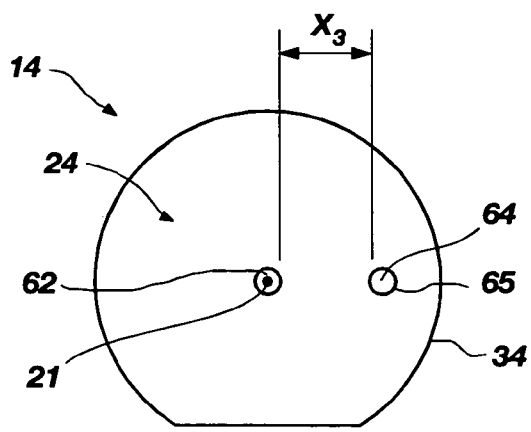
FIGS. 3A-3D are top plan views like those shown in FIGS. 2A-2D illustrating an additional contact area resulting from the direction of additional liquid toward the surface of the fabrication substrate.

Optionally, at least one additional stream of liquid 24 may be directed onto the surface 15 of the fabrication substrate 14. For example, as liquid 24 spreads out across the surface 15 of the fabrication substrate 14, voids in the sheet or film of liquid 24 may occur near the peripheral edges 34 of the fabrication substrate 14. Such voids may contribute to the deposition of water marks, residue, or other unwanted matter on the surface 15 of the fabrication substrate 14, and may be undesirable. Referring to FIG. 3A in combination with FIG. 1, the programmable logic controller 58 may be programmed to concurrently direct at least one additional stream of liquid 24 onto at least one additional contact area 64 on the surface 15 of the fabrication substrate 14 to prevent or reduce the occurrence of voids in the sheet or film of liquid 24 near the peripheral edges 34 of the fabrication substrate 14.

FIGS. 3A-3D are similar to FIGS. 2A-2D respectively, and illustrate the use of an additional stream of liquid 24 to rinse the surface 15 of the fabrication substrate 14 to prevent or minimize the occurrence of voids in the sheet or film of liquid 24 proximate the peripheral edges 34 of the fabrication substrate 14. Referring to FIG. 3A, the programmable logic controller 58 may be programmed to cause at least one liquid dispenser 22 to direct a stream of liquid 24 onto an additional contact area 64 on the surface 15 of the fabrication substrate 14. The second contact area 64 may be positioned on the surface 15 of the fabrication substrate 14 so as not to include or cover the center of rotation 21.

Figure 3B:
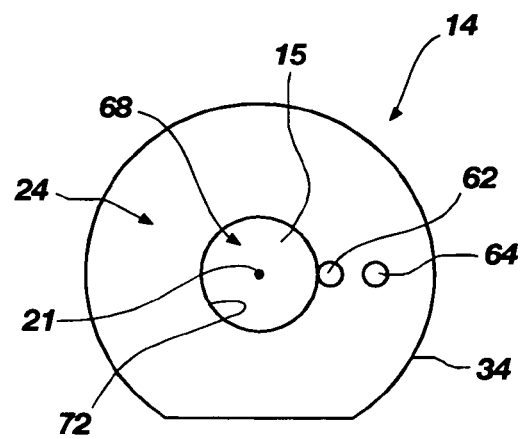
Figure 3C:
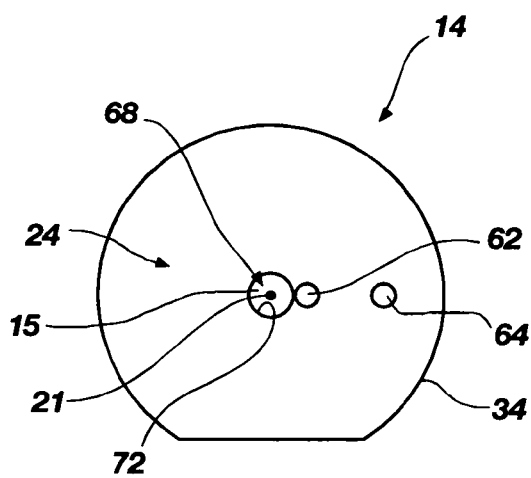

As illustrated in FIGS. 3A-3C, the additional stream of liquid 24 may be directed onto the surface 15 of the fabrication substrate 14 while the first contact area 62 is in one or more of the first position shown in FIG. 3A, the second position shown in FIG. 3B, and the third position shown in FIG. 3C. The additional stream of liquid 24 may be directed onto the surface 15 of the fabrication substrate 14 while the first contact area 62 is in each of the first position shown in FIG. 3A, the second position shown in FIG. 3B, and the third position shown in FIG. 3C. Additionally, the additional liquid 24 may be directed onto the surface 15 of the fabrication substrate 14 while the first contact area 62 is in only the second position shown in FIG. 3B and the third position shown in FIG. 3C, or only while the first contact area 62 is in the third position shown in FIG. 3C. Furthermore, the position of the additional contact area 64 on the surface 15 of the fabrication substrate 14 may vary as the first contact area 62 moves between the first position shown in FIG. 3A, the second position shown in FIG. 3B, and the third position shown in FIG. 3C.

As shown in FIG. 3A, the fabrication substrate 14 may have a diameter D. By way of example and not limitation, an outer periphery 65 of the second contact area 64 may be separated from the rotational axis 20 by a distance $X_3$ that is greater than about fifty percent (50%) of the diameter D (FIG. 2A) of the fabrication substrate 14 while the first contact area 62 is in the first position shown in FIG. 3A, the second position shown in FIG. 3B, and the third position shown in FIG. 3C.

Figure 3D:
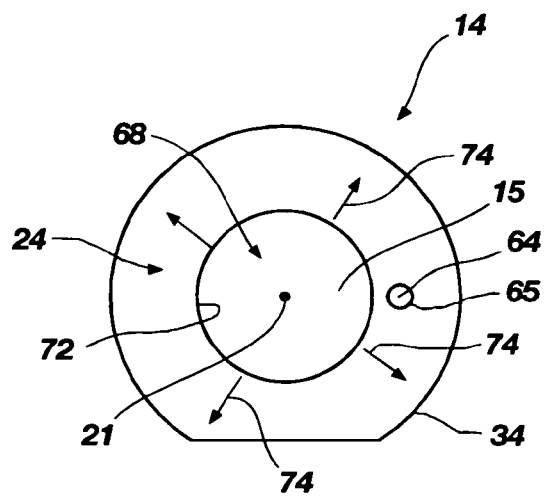

As shown in FIG. 3D, a stream of liquid 24 may continue to be directed onto the additional contact area 64 until the inner diameter 72 of the annular-shaped sheet or film of liquid 24 approaches or reaches the additional contact area 64 after closing a flow control valve 32 to interrupt the stream of liquid 24 being directed at the first contact area 62 of the surface 15 of the fabrication substrate 14. As the inner diameter 72 of the annular-shaped sheet or film of liquid 24 approaches or reaches the outer periphery 65 of the additional contact area 64, the stream of liquid 24 being directed at, or impinging on, the additional contact area 64 on the surface 15 of the fabrication substrate 14 may also be interrupted while continuing to spin the fabrication substrate 14 until the liquid 24 has been substantially completely removed from the surface 15 of the fabrication substrate 14.

In the systems and methods previously described in relation to FIGS. 1, 2A-2D, and 3A-3D, the contact area 62 is moved relative to the surface 15 of the fabrication substrate 14 along a substantially linear path disposed along a line that includes the center of rotation 21. As an alternative or in addition, the contact area 62 may be moved relative to the surface 15 of the fabrication substrate 14 along a curved or curvilinear path or any other nonlinear path.

Figure 4A:
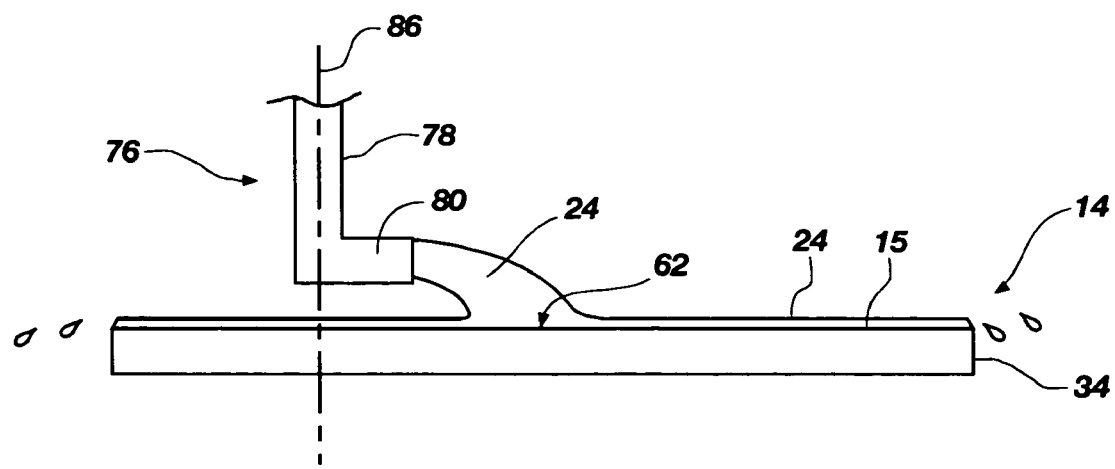
FIG. 4A is a side view of a fabrication substrate and another embodiment of a liquid-dispensing element that may be used in the system shown in FIG. 1.

Another embodiment of a liquid dispenser 76 is shown in FIG. 4A that may be used in the system 10 shown in FIG. 1.

The liquid dispenser 76 may be configured to dispense a stream of liquid 24 in a lateral or horizontal direction relative to the surface 15 of the fabrication substrate 14, as shown in FIG. 4A. By way of example and not limitation, the liquid dispenser 76 may include a tube or conduit portion 78 and an outlet portion 80 configured to dispense a stream of liquid 24 in a lateral direction relative to the surface 15 of the fabrication substrate 14. The liquid 24 may fall onto a contact area 62 on the surface 15 of the fabrication substrate 14 that is laterally spaced from the liquid dispenser 76, as shown in FIG. 4A. In this configuration, the position of the contact area 62 may be selectively moved across the surface 15 of the fabrication substrate 14 by, for example, rotating the liquid dispenser 76 about a dispenser axis 86. Referring the FIG. 4B, in such a configuration, the contact area 62 may be moved to a first position, from the first position to a second position, and from the second position, to a third position in accordance with the method described in reference to the first contact area 62 shown in FIGS. 2A-2C, by selectively rotating the liquid dispenser 76 about the dispenser axis 86.

Figure 4B:
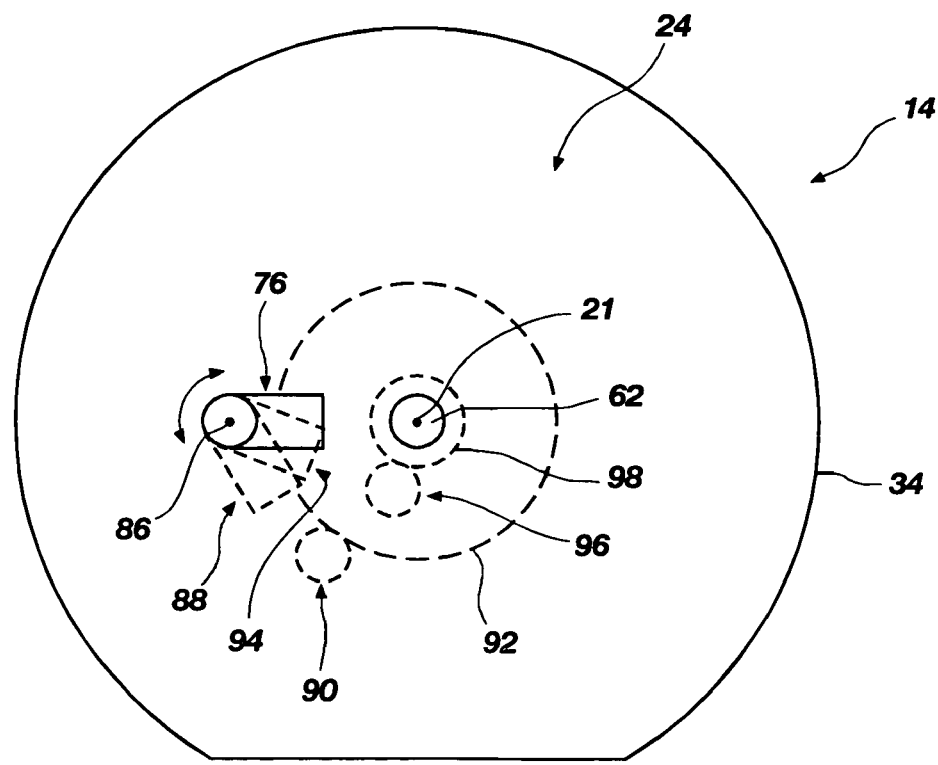
FIG. 4B is a top plan view of the fabrication substrate and the liquid-dispensing element shown in FIG. 4A.

The liquid dispenser 76 is shown in FIG. 4B rotated to a position about the dispenser axis 86 such that the contact area 62 is disposed in a first position that includes or covers the center of rotation 21. In at least a portion of a processing sequence, a programmable logic controller 58 (FIG. 1) may be programmed to rotate the liquid dispenser 76 about the dispenser axis 86 from the first position to a second position 88 such that the contact area 62 moves in a radially outward direction from the first position to a second position 90 to form a substantially circular, substantially dry region on the surface 15 of the fabrication substrate 14 having an outer diameter approximately represented by dashed line 92. Moreover, the programmable logic controller 58 (FIG. 1) may be programmed to rotate the liquid dispenser 76 about the dispenser axis 86 from the second position 88 to a third position 94 such that the contact area 62 moves in a radially inward direction from the second position 90 to a third position 96 to reduce the diameter of the substantially circular, substantially dry region to a size approximately represented by dashed line 98.

In this manner, the liquid dispenser 76 may be selectively rotated or moved about the dispenser axis 86 to selectively move the contact area 62 to a first position including the center of rotation 21, from the first position radially outward to a second position 90, and from the second position 90 radially inward to a third position 96 in accordance with the method previously described in reference to FIGS. 2A-2C.

In the systems and methods previously described herein, the contact area 62 is moved relative to the surface 15 of the fabrication substrate 14 by moving the position of the one or more liquid dispensers 22, 76 relative to the surface 15 of the fabrication substrate 14. In other examples of systems and methods that embody teachings of the present invention, the contact area 62 may be moved relative to the surface 15 of the fabrication substrate 14 by means other than a moveable liquid dispenser 22, 76.

Figure 5:
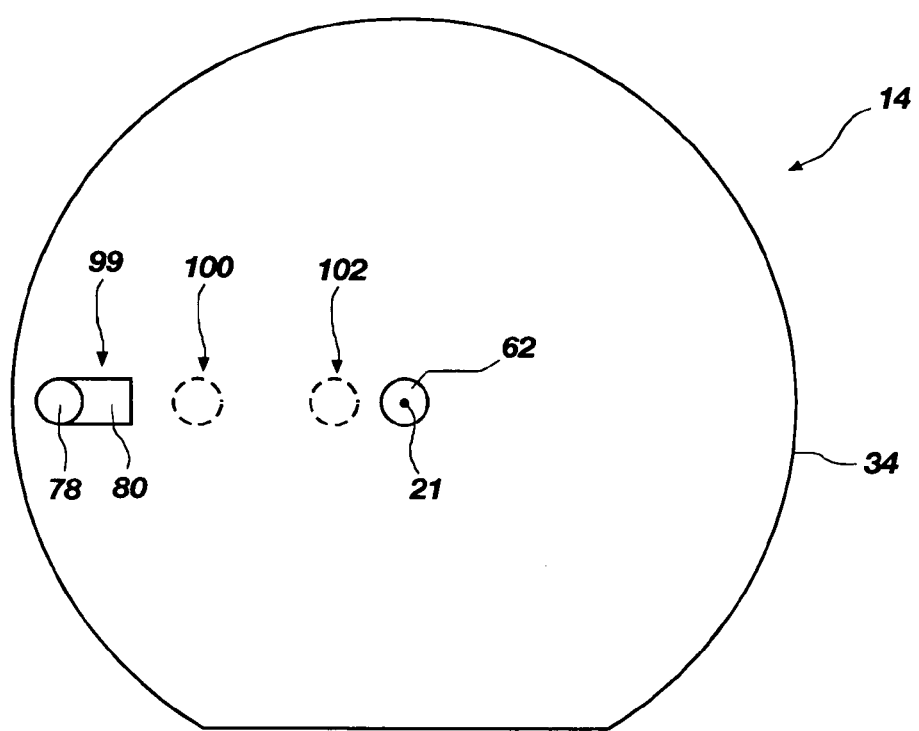
FIG. 5 is a top plan view of a fabrication substrate and another embodiment of a liquid-dispensing element that may be used in the system shown in FIG. 1.

For example, the system 10 (FIG. 1) may include a liquid dispenser 99 as shown in FIG. 5, which may be configured to have a size and shape similar to the liquid dispenser 76 shown in FIG. 4A. The liquid dispenser 99 may be positioned relative to the surface 15 of the fabrication substrate 14 radially outward from the center of rotation 21, and oriented such that an outlet portion 80 of the liquid dispenser 99 directs a stream of liquid 24 (not shown in FIG. 5) emitted thereby in a radially inward direction towards the center of rotation 21. In such a configuration, the liquid dispenser 99 may be configured to selectively vary the position of the contact area 62 between the stream of liquid 24 and the surface 15 of the fabrication substrate 14 by selectively varying the pressure of the liquid 24 inside the liquid dispenser 76. The system 10 (FIG. 1) may include a selectively variable pressure control valve (not shown) in or along the fluid liquid supply lines 30, and the programmable logic controller 58 may communicate with and be configured to selectively control the selectively variable pressure control valve.

In this configuration, the programmable logic controller 58 (FIG. 1) may be programmed to vary the pressure of the liquid 24 inside the liquid dispenser 99, thereby selectively moving the contact area 62 on the surface 15 of the fabrication substrate 14. The programmable logic controller 58 may be programmed to move the contact area 62 (by varying the pressure of the liquid 24 in the liquid dispenser 99) to a first position that includes the center of rotation 21 (which may allow liquid 24 to substantially cover the surface 15 of the fabrication substrate 14), from the first position radially outward to a second position 100, and from the second position 100 radially inward to a third position 102, in a manner substantially similar to those previously described in reference to FIGS. 2A-2D. As such, it may not be necessary to displace (e.g., move or rotate) the liquid dispenser 99 relative to the surface 15 of the fabrication substrate 14 in order to move the contact area 62 according to methods that incorporate teachings of the present invention.

Each of the methods described herein includes forming a substantially continuous annular-shaped sheet or film of liquid 24 on the surface 15 of a spinning fabrication substrate 14, the annular-shaped sheet or film of liquid 24 having an inner diameter 72 defining a void in the sheet or film of liquid 24, as well as reducing the size of the inner diameter 72 of the annular-shaped sheet or film of liquid 24, then subsequently enlarging the inner diameter 72 of the annular-shaped sheet or film of liquid 24 until substantially no liquid 24 remains on the surface 15 of the fabrication substrate 14.

Figure 2D:
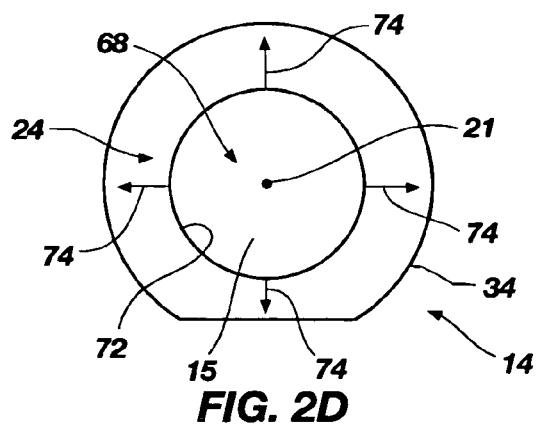

In any of the previously described systems and methods, a stream of air or gas (such as, for example, clean dry air, nitrogen or another inert gas, etc.) may be directed at the surface 15 of the fabrication substrate 14 to facilitate the formation of a substantially circular, substantially dry region, such as the substantially circular, substantially dry region 68 shown in FIGS. 2B-2D. Referring to FIGS. 2A-2B, and by way of example and not limitation, a stream of air or gas may be directed at the surface 15 of the fabrication substrate 14 at or proximate to the center of rotation 21 of the fabrication substrate 14 as the contact area 62 is moved from the first position shown in FIG. 2A to the second position shown in FIG. 2B. The stream of air or gas may continue to be directed at the surface 15 of the fabrication substrate 14 while the contact area 62 is in the second position shown in FIG. 2B, the third position shown in FIG. 2C, and until the liquid 24 has been substantially removed from the surface 15 of the fabrication substrate 14 after interrupting the flow of liquid 24 onto the contact area 62.

The inventors of the present invention have discovered, however, that by moving a contact area 62 in the manners and sequences previously described herein, the deposition of water marks, residue, or other unwanted matter on the surface 15 of a fabrication substrate 14 may be substantially minimized or eliminated. In this manner, the methods and systems of the present invention may facilitate rinsing and drying of a fabrication substrate while minimizing the deposition of water marks, contaminant residue, or other unwanted matter onto the surface of the substrate. Furthermore, methods and systems that embody teachings of the present invention may allow the liquid to be removed from the surface of a fabrication substrate faster than conventional methods and systems, and as a result, may reduce the amount of time required to dry semiconductor substrates. For example, methods and systems that embody teachings of the present invention may allow the liquid to be removed from the surface of a fabrication substrate up to twenty-percent (20%) faster than conventional methods and systems.

While systems that embody teachings of the present invention have been described in relation to what are referred to as spin, rinse, and dry (SRD) systems, the teachings of the present invention may be equally applicable to other semiconductor fabrication processes and systems in which a liquid is dispensed onto and removed from at least one surface of a spinning fabrication substrate. This may be particularly so in fabrication processes that involve liquids in which the surface tension of the liquid affects the removal of the liquid from the surface of the spinning fabrication substrate. By way of example and not limitation, wet etch systems and chemical-mechanical polishing (CMP) systems may also embody teachings of the present invention. As such, liquids dispensed from systems that embody teachings of the present invention may include clean de-ionized water, acids, solvents, or any other single- or multi-component liquid, solution, suspension or emulsion.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims which follow.

What is claimed is:

1. A method for processing a surface of a semiconductor wafer, the method comprising:
    continuously spinning a fabrication substrate about a rotational axis oriented at least substantially perpendicular to an at least substantially planar surface of the fabrication substrate while directing a stream of liquid onto the surface;
    forming an at least substantially continuous annular-shaped sheet or film of the liquid on the surface, the annular-shaped sheet or film of the liquid having an inner diameter defining an at least substantially liquid-free void;
    reducing the size of a diameter of the substantially liquid-free void; and
    spinning at least substantially all of the liquid off of the surface of the fabrication substrate.

2. The method of claim 1, further comprising interrupting contact between the stream of liquid and the surface while continuing to spin the fabrication substrate until the fabrication substrate is substantially dry.

3. The method of claim 1, wherein providing a fabrication substrate comprises providing a full semiconductor wafer, a partial semiconductor wafer, or a bulk semiconductor substrate in other than wafer form.

4. The method of claim 1, wherein forming a substantially continuous annular-shaped sheet or film of the liquid on the surface comprises forming a substantially continuous annular-shaped sheet or film of the liquid on the surface, the annular-shaped sheet or film of the liquid having an inner diameter defining a substantially liquid-free void, the inner diameter being greater than about ten percent of a diameter of the fabrication substrate.

5. The method of claim 4, wherein reducing the size of a diameter of the substantially liquid-free void comprises reducing the size of a diameter of the substantially liquid-free void to less than about ten percent of the diameter of the fabrication substrate.

6. The method of claim 4, wherein reducing the size of a diameter of the substantially liquid-free void comprises reducing the size of a diameter of the substantially liquid-free void to less than about one centimeter.

7. The method of claim 1, wherein forming a substantially continuous annular-shaped sheet or film of the liquid on the surface comprises forming a substantially continuous annular-shaped sheet or film of the liquid on the surface using the stream of liquid and at least one additional stream of liquid.

8. The method of claim 7, further comprising directing the at least one additional stream of liquid onto the surface of the fabrication substrate proximate a peripheral edge of the fabrication substrate.

9. The method of claim 7, further comprising directing the at least one additional stream of liquid onto the surface of the fabrication substrate after interrupting contact between the stream of liquid and the surface while continuing to spin the fabrication substrate, and subsequently interrupting contact between the additional stream of liquid and the fabrication substrate while continuing to spin the fabrication substrate until the fabrication substrate is substantially dry.

10. The method of claim 1, wherein continuously spinning the fabrication substrate comprises continuously spinning the fabrication substrate at greater than about 500 revolutions per minute until the fabrication substrate is substantially dry.

11. The method of claim 1, wherein continuously spinning the fabrication substrate comprises spinning the fabrication substrate at greater than about 4,000 revolutions per minute.

12. The method of claim 1, wherein continuously spinning the fabrication substrate comprises:
    spinning the fabrication substrate at greater than about 2,000 revolutions per minute prior to interrupting contact between the stream of liquid and the surface; and
    spinning the fabrication substrate at between about 500 revolutions per minute and about 1,000 revolutions per minute after interrupting contact between the stream of liquid and the surface until the surface is substantially dry.

13. The method of claim 1, wherein a stream of air or gas is not directed at the surface of the fabrication substrate while forming a substantially continuous annular-shaped sheet or film of the liquid on the surface, the annular-shaped sheet or film of the liquid having an inner diameter defining a substantially liquid-free void.

14. The method of claim 1, wherein directing a stream of liquid onto the surface of the fabrication substrate comprises directing a stream of liquid comprising de-ionized water onto the surface of the fabrication substrate.

15. A method for processing a surface of a semiconductor wafer, the method comprising:
    continuously spinning a fabrication substrate about a rotational axis oriented at least substantially perpendicular to an at least substantially planar surface of the fabrication substrate while directing a stream of liquid onto the surface;
    forming an at least substantially continuous annular-shaped sheet or film of the liquid on the surface, the annular-shaped sheet or film of the liquid having an inner diameter defining an at least substantially liquid-free void; and
    selectively manipulating the at least substantially continuous annular-shaped sheet or film of the liquid; and
    removing at least substantially the entire annular-shaped sheet or film of the liquid from the surface of the fabrication substrate after selectively manipulating the annular-shaped sheet or film of the liquid.

16. The method of claim 15, wherein selectively manipulating the substantially continuous annular-shaped sheet or film of the liquid comprises selectively manipulating the size of the inner diameter of the substantially liquid-free void.

17. The method of claim 16, wherein selectively manipulating the size of the inner diameter of the substantially liquid-free void comprises selectively reducing the size of the inner diameter of the substantially liquid-free void.

18. The method of claim 17, further comprising selectively enlarging the size of the inner diameter of the substantially liquid-free void.

19. The method of claim 18, wherein selectively enlarging the size of the inner diameter of the substantially liquid-free void comprises selectively enlarging the size of the inner diameter of the substantially liquid-free void after selectively reducing the size of the inner diameter of the substantially liquid-free void.

* * * * *